United States Patent [19]

Ono et al.

[11] 4,374,431
[45] Feb. 15, 1983

[54] I²L SEMICONDUCTOR MEMORY CIRCUIT DEVICE

[75] Inventors: Chikai Ono, Kawasaki; Kazuhiro Toyoda, Yokohama, both of Japan

[73] Assignee: Fujitsu Limited, Kawasaki, Japan

[21] Appl. No.: 210,678

[22] Filed: Nov. 26, 1980

[30] Foreign Application Priority Data

Nov. 28, 1979 [JP] Japan .................................. 54/154025
Nov. 30, 1979 [JP] Japan .................................. 54/155340

[51] Int. Cl.³ ............................................. G11C 11/40
[52] U.S. Cl. ..................................... 365/174; 365/104
[58] Field of Search ........................ 365/104, 174, 189

[56] References Cited

U.S. PATENT DOCUMENTS 4,228,525 10/1980 Kawarada ........................... 365/104

Primary Examiner—Terrell W. Fears
Attorney, Agent, or Firm—Staas & Halsey

[57] ABSTRACT

A semiconductor memory circuit device is disclosed. The semiconductor memory circuit device is conventionally comprised of a plurality of memory-cell arrays. Each of the memory-cell arrays is conventionally provided with a plurality of IIL memory cells, a pair of positive word line and negative work line and further a plurality of bit lines. In the semiconductor memory circuit device, at least one means for discharging electric charges is newly incorporated with each negative word line. Said means becomes active only when the corresponding memory-cell array changes from selection status to non-selection status.

23 Claims, 25 Drawing Figures

I²L SEMICONDUCTOR MEMORY CIRCUIT DEVICE

BACKGROUND OF THE INVENTION

The present invention relates to a semiconductor memory circuit device comprised of a plurality of memory-cell arrays, each memory-cell array comprises a plurality of integrated injection logic elements.

At present, integrated injection logic elements (hereinafter referred to as IILs), are suitable elements for fabricating a memory circuit device because such IILs can be formed, as memory cells, with very high integration density. Such an IIL memory cell has been disclosed in, for example "Superintegrated memory shares functions on diffused islands", Electronics, Feb. 14, 1972, Pages 83 through 85, which mentions the basic idea of the IIL element.

Thus, the IILs can contribute to realize a superintegrated memory circuit device. However, on the other hand, the IILs have a defect in that it is difficult to perform very high speed read and write operations in the IIL memory circuit device due to the presence of a parasitic capacitor and a parasitic resistor, both of which are formed in the bulk for fabricating the IIL memory cells.

Therefore, it is an object of the present invention to provide a semiconductor memory circuit device, comprised of the IIL memory cells, which has a capability for performing very high speed read and write operations.

BRIEF DESCRIPTION OF THE DRAWINGS

The present invention will be more apparent from the ensuing description with reference to the accompanying drawings wherein.

DETAILED DESCRIPTION OF THE PREFERRED EMBODIMENTS

Figure 1:
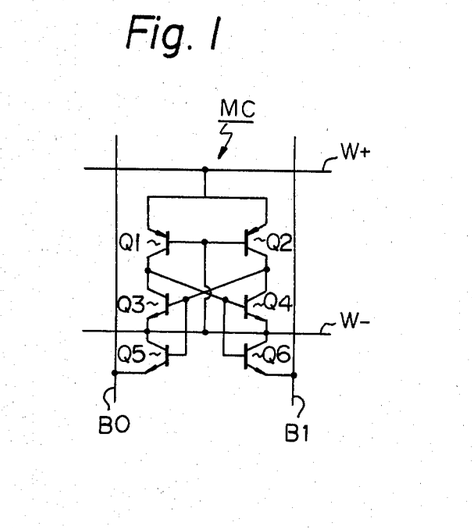
FIG. 1 illustrates an equivalent circuit diagram of a conventional IIL memory cell.

In FIG. 1, which illustrates an equivalent circuit diagram of a conventional IIL memory cell, an IIL memory cell MC is comprised of six transistors Q1, Q2, Q3, Q4, Q5 and Q6. These transistors Q1 through Q6 cooperate with a pair of a positive word line $W_+$ and a negative word line $W_-$ and at the same time a pair of "0" bit line B0 and a "1" bit line B1. The transistors Q3 and Q4 operate to store the logic of data. Either one of the transistors Q3 and Q4 holds the logic "1" and the other thereof holds the logic "0", alternately. The transistors Q1 and Q2 act as load transistors with respect to the transistors Q3 and Q4, respectively. The transistors Q5 and Q6 function as buffer transistors for achieving read and write operations. That is, when a read operation is conducted and if, for example, the transistor Q3 is conductive and the transistor Q4 is non-conductive, the voltage level at the base of the transistor Q3 is detected on the bit line B0 via the buffer transistor Q5, which voltage level is higher than that of the transistor Q4. The voltage level of the base of the transistor Q4 is detected on the bit line B1 via the buffer transistor Q6.

When a write operation is conducted and if, for example, the transistor Q4 is to be made conductive, a write current is absorbed from the transistor Q5 through the bit line B0. At this time, the base current to be supplied to the transistor Q3 is shunted to the base of the transistor Q5, and thus the transistor Q3 is made non-conductive and alternately the transistor Q4 is made conductive. These read and write operations are effective only when the IIL memory cell MC is selected, when a typical word decoder (not shown) supplies positive voltage to the word line $W_+$. Since the memory cell is formed as a static memory cell containing a flip-flop therein, two word lines $W_+$ and $W_-$ are required.

Figure 2:
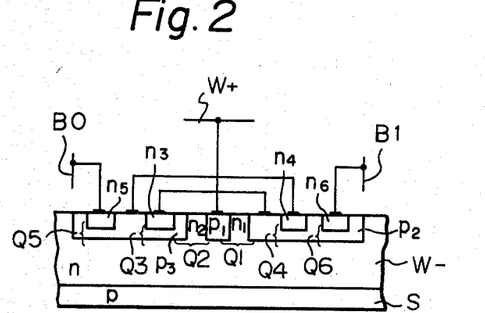
FIG. 2 is a cross sectional view of a semiconductor device for fabricating the IIL memory cell of FIG. 1.

The reason why the IIL memory cell is useful for fabricating a highly integrated memory circuit device, will be clarified with reference to FIG. 2. FIG. 2 is a cross sectional view of a semiconductor device for fabricating the IIL memory cell. In FIG. 2, members which have the same reference symbols as those of FIG. 1, are identical to each other. A p-type region p1 is an injector, connected to the word line $W_+$. The injector p1 acts as an emitter which is common to the emitter of each of the lateral pnp transistors Q1 and Q2. The collectors of the transistors Q1 and Q2 are represented by p-type regions p2 and p3, respectively. The p-type regions p2 and p3 function simultaneously as the bases of the transistors Q2 and Q4, respectively and as the bases of the transistors Q5 and Q6, respectively. The regions p2 and p3 contain therein n-type regions (n4, n6) and (n3, n5), respectively. The regions n3 and n4 act as the collectors of the transistors Q3 and Q4, respectively. The regions n5 and n6 act as the emitters of the transistors Q5 and Q6, respectively. The symbol n denotes a bulk, that is an epitaxial growth layer formed on a p-type substrate S. The layer n functions as a base which is common to the base of each of the transistors Q1 and Q2 and simultaneously functions as an emitter which is common to the emitter of each of the transistors Q3 and Q4 and also as a collector which is common to the collector of each of the transistors Q5 and Q6. Further, it should be noted that the bulk n also functions as the word line $W_-$ which is common to the word line of other IIL memory cells (not shown) arranged on the same memory-cell array. As will be understood from the above explanations with reference to FIG. 2, specified particular regions are commonly occupied by the transistors, and accordingly, the highly integrated memory circuit device can be obtained. Further, since the word line $W_-$ is not distributed on the surface of the semiconductor device, as happens in the typical static memory device, but is constructed by the bulk n itself, it is easy to obtain such a highly integrated memory circuit device.

Figure 3:
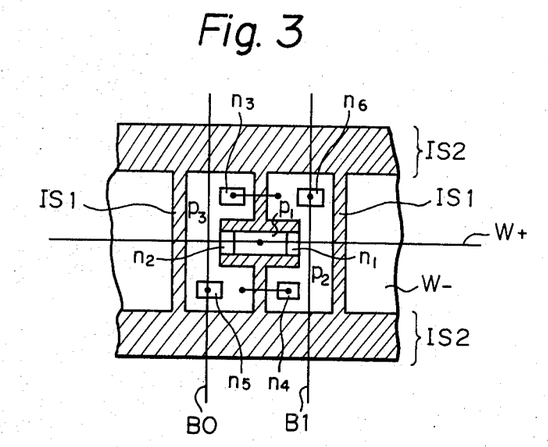
FIG. 3 is a plan view of the IIL memory cell MC shown as the equivalent circuit diagram in FIG. 1.

A plan view of the IIL memory cell MC, shown as the equivalent circuit in FIG. 1, is illustrated in FIG. 3. In FIG. 3, the members which have the same reference symbols as those of FIGS. 1 and 2, are functionally identical to each other. Generally, the IIL memory cells MC are arranged straight in a first direction along each memory-cell array and at the same time the memory-cell arrays are arranged in a second direction being perpendicular to the first direction, and therefore, the n-type and p-type regions should be arranged with a certain layout, such as shown in this FIG. 3, which is suitable for arranging such memory-cell arrays. Thus, it should be understood that the cross sectional view of the memory cell MC shown in FIG. 3 does not coincide with that of the memory cell MC shown in FIG. 2, because FIG. 2 illustrates merely a basic arrangement of the n-type and p-type regions. In FIG. 3, the word line $W_+$ extending in the first direction, the bit lines B0, B1 extending in the second direction, and various kinds of p-type and n-type regions have already been explained. The above mentioned word line $W_-$ cannot be seen in this figure, because the line $W_-$ is constructed by the bulk itself. The reference symbols IS1 and IS2, corresponding to regions indicated by hatching lines extending from top right to bottom left, represent isolation regions. The isolation regions IS1 are introduced into the device, so as to prevent parasitic pnp transistors from forming between each adjacent memory cells MC. These isolation regions IS1 can be shallow isolation regions, which is also one of the factors for realizing a highly integrated memory circuit device. The isolation regions IS2 are introduced into the device, so as to electrically separate each adjacent memory-cell array from each other. These isolation regions IS2 should be deep isolation regions.

Figure 4:
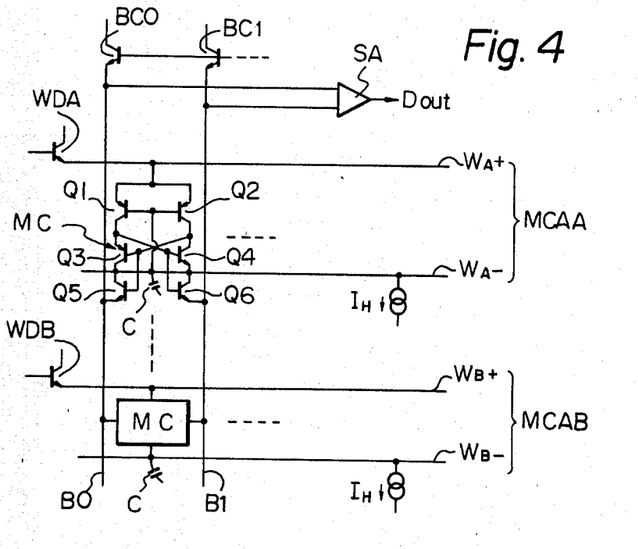
FIG. 4 illustrates an equivalent circuit diagram of partial memory-cell arrays and their peripheral members.

FIG. 4 illustrates an equivalent circuit diagram of partial memory-cell arrays and their peripheral members. In FIG. 4, the reference symbols MCAA and MCAB represent memory-cell arrays of certain row (A) and another row (B), respectively. The memory-cell arrays MCAA and MCAB are, respectively provided with word lines ($WA_+$, $WA_-$) and ($WB_+$, $WB_-$). A plurality of IIL memory cells MC are arranged, with certain pitch, along respective memory-cell arrays. Although the memory cell MC (only one memory cell is illustrated) of array MCAA is illustrated in detail, but the memory cell (only one memory cell is illustrated) of array MCAB is illustrated by merely a black box (MC). The memory-cell arrays MCAA and MCAB are selectively activated (selection status) or not activated (non-selection status) by means of conventional word drivers WDA and WDB via corresponding word lines $WA_+$ and $WB_+$. The data to be read is transferred from a specified memory cell to a conventional sense amplifier SA via the bit lines B0 and B1. The reference symbol $D_{out}$ denotes a read data from the amplifier SA. The reference symbols BC0 and BC1 represent conventional bit clampers which are employed so as to maintain the voltage level of the bit lines to be desired respective threshold voltage levels. The reference symbols $I_H$ denote conventional hold-current sources. Each of the hold-current source $I_H$ absorbs a constant hold current from corresponding word line ($WA_-$, $WB_-$), which the constant hold current is very important to maintain the logic states of data, stored in either the transistors Q3 or Q4, as it is until the logic state of the data is rewritten.

Figure 5:
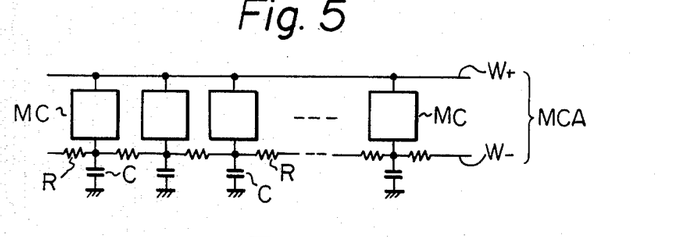
FIG. 5 schematically illustrates an equivalent circuit diagram of the memory-cell array.
Figure 6:
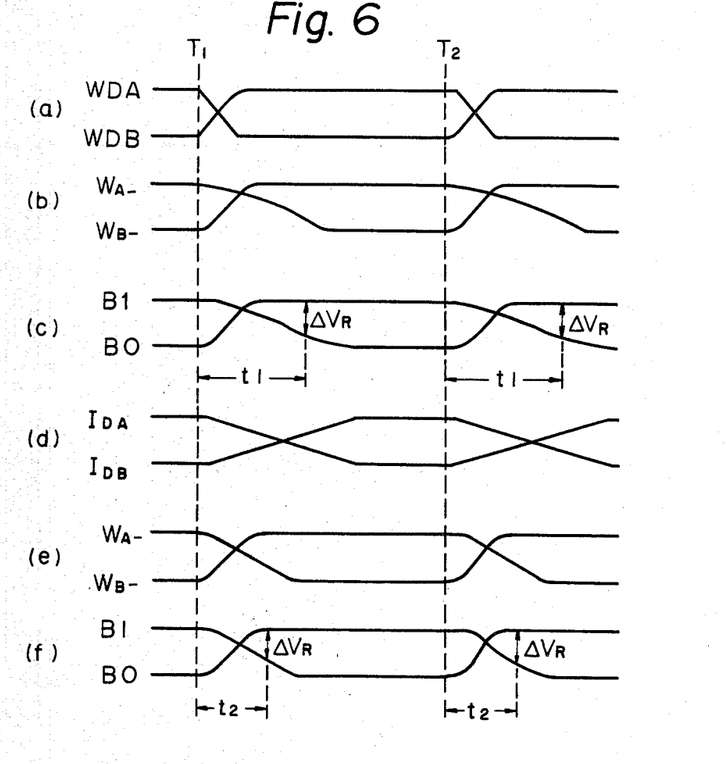
FIG. 6 depicts waveforms of voltage signals and current signals appearing in the circuit shown in FIG. 4.

As previously mentioned, the proposed IIL memory cell device has an advantage in that it can contribute to realize a superintegrated memory circuit device, wherein the following fact is one of the factors which can realize the highly integration of memory cells. That is, the bulk itself functions as the word line $W_-$, simultaneously. However, the following disadvantages are also produced. That is, firstly, the resistance value of the word line $W_-$ is relatively higher than the conventional word line $W_-$, made of, for example aluminum, due to the presence of parasitic resistors located inside the bulk. Secondly, parasitic capacitors are formed inside the semiconductor device, between the bulk n and the substrate S (refer to FIG. 2). It should be understood that the above mentioned parasitic resistors and capacitors make the speed for performing read and write operations considerably slow. The parasitic resistors and capacitors are schematically illustrated in FIG. 5 which is an equivalent circuit diagram of the memory-cell array MCA. In FIG. 5, the parasitic resistors and the parasitic capacitors are represented by the reference symbols R and C, respectively. Other members $W_+$, $W_-$ and MC have already been explained. Due to the presence of the parasitic resistors R and capacitors C (the capacitor C is also shown in FIG. 4), the response time of the word line $W_-$ is relatively long. To be specific, it takes a relatively long time for the word line W_ to change from "H" (high) voltage level (selection status) of the word line W_ to "L" (low) voltage level (non-selection status) thereof. At the same time, the bit current, flowing through one memory cell which is situated in a condition changing from the selection status to the non-selection status, is generated for a relatively long time. As a result, the following two problems occur. The first problem is that the access time for achieving the read operation, is considerably long, which means that high speed read operation cannot be expected. This is because, the logic state of one previously selected memory cell is maintained on one bit line for a relatively long time, the logic state of the other memory which is going to be read from the sense amplifier, can not be detected quickly from the same bit line. The second problem is that the write operation cannot be achieved with a high degree of accuracy when a high speed write operation is conducted. In other words, a so-called write error, that is a "double write", is produced. This is because, since it takes a long time for the word line W_ to change from "H" voltage level to "L" voltage level, the bit current continues flowing through the memory cell which is situated in a condition changing from the selection status to the non-selection status for a long time. In this case, if the write current is supplied to the same bit line simultaneously in order to write the desired logic state of data in another memory cell, both memory cells are left in the write condition, simultaneously, which means the occurrence of said "double write", and accordingly, the above mentioned write error takes place. It should be understood that the above mentioned two problems result from the one general fact that the voltage level of the word line W_ changes from "H" to "L" too slowly. This general fact will also be clarified with reference to FIG. 6 and also FIG. 4. FIG. 6 depicts waveforms of the voltage signal or the current signal appearing in the circuit shown in FIG. 4. In FIG. 6, row (a) depicts waveforms of the voltage signals appearing at the bases of the word drivers WDA and WDB (see FIG. 4). Row (b) depicts waveforms of the voltage signals appearing on the word lines WA_ and WB_ of the memory-cell arrays MCAA and MCAB (see FIG. 4), respectively. Row (c) depicts waveforms of voltage signals appearing on the bit lines B0 and B1 (see FIG. 4). First, taking as an example a case, as shown in row (a) of FIG. 6, where the voltage level, at the base of the word driver WDA, is "H" and further any one of the memory cells MC, contained in the memory-cell array MCAA, is in the selection status, that is the selected memory cell MC is now providing the logic state of the stored data to the bit line, and next, at the time T$_1$, the voltage level, at the base of the word driver WDA, falls from the level "H" to the level "L" and at the same time, the voltage level, at the base of the word driver WDB, rises from the level "L" to the level "H", and lastly one of the memory cells MC, in the memory-cell array MCAB, is selected. In this case, the stored logic of the last selected memory cell, in the memory-cell array MCAA, is different from that of the newly selected memory cell, in the memory-cell array MCAB. Under the above mentioned conditions, the voltage level on the word line WA_ falls from the level "H" to the level "L", because the memory-cell array MCAA changes from the selection status to the non-selection status. However, at this time, the change from the selection status to the non-selection status takes place very slowly. This is because, the voltage level on the word line WA_ falls very slowly from the level "H" to the level "L", due to the presence of the aforesaid parasitic capacitors C and parasitic resistors R, which exist along the word line WA_. The slow fall of the level on the word line WA_ will be clarified with reference to row (b) of FIG. 6. Consequently, the voltage level on the bit line B1 also changes very slowly from the level "H" to the level "L", as shown in row (c) of FIG. 6. It should be noted that, referring to FIG. 4, the voltage level on the bit line B1 changes in proportion to the voltage level on the word line WA_, through the transistors Q4 and Q6.

The read operation becomes effective when the voltage difference between the bit lines B0 and B1 exceeds a predetermined reference voltage (refer to the voltage "VR" in row (c) of FIG. 6). Thus, the access time for reading data can be defined by the time t1 (refer to the row (c)). A similar read operation can also occur after the time T$_2$.

In order to achieve a high speed read operation, the access time t1 should be shortened. In other words, the time, required for discharging the electric charges on the word line WA_, should be shortened. Accordingly, referring to FIG. 4, a large hold current must be absorbed by the hold-current sources $I_H$, so as to shorten the time t1 which is required, as mentioned above, for discharging the electric charges on the word line WA_. However, the best way to shorten the time t1 is not by increasing the magnitude of the hold current, at least from an economic point of view. This is because, the non-selected memory-cell arrays waste too much hold current. The waste of the hold current becomes very noticeable, if the semiconductor memory device is fabricated as a large capacity RAM (random access memory).

Since, as previously mentioned, the voltage level on the word line W_ changes from level "H" to level "L" very slowly, the aforesaid write error, that is the double write, is induced. Referring to FIG. 4, the voltage levels, at the bases of the transistors Q3 and Q4 in the memory-cell array MCAA, which changes from the selection status to the non-selection status, change slowly due to the slow change, from the level "H" to the level "L", of the voltage level on the word line WA_. Therefore, if another write current is supplied to the bit line during the slow change of the voltage levels at the bases of transistors Q3 and Q4, the write current is shunted to the transistors Q3 and Q4 again, even though these transistors Q3 and Q4 are desired to be in the non-selection status. Thus, an undesired write error occurs. The waveforms shown in rows (d), (e) and (f) of FIG. 6 will be explained hereinafter.

As explained above in detail, the conventional IIL memory circuit device has two problems, the first is that a very high speed read operation cannot be expected and the second one thereof resides in the fact that the undesired write error or the double write.

The IIL memory circuit device of the present invention introduces a discharging means for discharging the electric charges stored in the parasitic capacitors C distributed along the word lines W_. Each of the word lines W_ has at least one discharging means. The discharging means become operative only when the corresponding memory-cell array changes from the selection status to the non-selection status. Further, the electric charges, stored in the memory-cell array which is being changed from the selection status to the non-selection status, are absorbed via the discharging means with the aid of a constant-current source.

Returning to FIG. 6, the memory-cell array to be selected, MCAB, is switched at the time $T_1$. At this time, the discharging currents $I_{DA}$ and $I_{DB}$, flowing respectively through the arrays MCAA and MCAB, change, as shown in row (d). Further, the transition from $I_{DA}$ to $I_{DB}$ (see row (d)) takes place after the occurrence of the transition from $WA_-$ to $WB_-$ (see row (b)). Therefore, the discharging current continues flowing even though the transition, from $WA_-$ to $WB_-$ has been completed. As a result, the electric charges, stored in the parasitic capacitors C along the word line $WA_-$, are absorbed as the discharging current by the constant-current source via the discharging means, even though the selection status of the memory-cell arrays has switched from the array MCAA to the MCAB, has. Thus, the voltage level on the word line $WA_-$ changes from the level "H" to the level "L" faster, as shown in row (e), than that shown in row (b). At the same time, the voltage difference between the bit lines B0 and B1 exceeds the reference voltage $\Delta VR$ after the elapse of the time $t2$ (see row (f)) which occurs sooner than the time $t1$ (see row (c)). That is, a short access time ($t2$) for reading data is obtained. On the other hand, the above mentioned write error, or the double write, can also be eliminated.

Figure 7A:
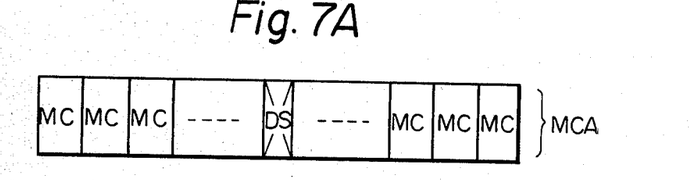
FIGS. 7A and 7B illustrate arrangements of discharging means DS of the present invention with respect to the conventional IIL memory cells MC.
Figure 7B:
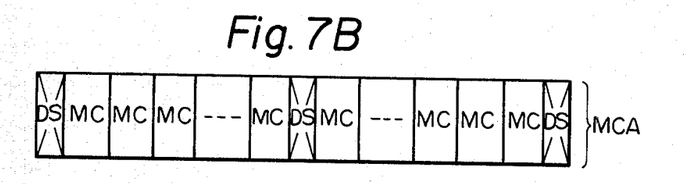

In each of the memory-cell arrays MCA, the discharging means should be located at a particular position or positions. If one discharging means is employed in each memory-cell array MCA, the discharging means should be located at the center of the array MCA, as shown in FIG. 7A. While, if a plurality of discharging means, for example three means, are employed in each memory-cell array MCA, should be uniformly distributed along the array MCA, as shown in FIG. 7B. In FIGS. 7A and 7B, MC indicates the memory cells, identical with those shown in FIGS. 1, 4 and 5. The label DS represents the discharging members according to the present invention. The discharging means DS operate with one or more constant-current sources, but these are not illustrated in these figures. The arrangement, illustrated in FIG. 7A, is suitable for the construction of relatively small capacity RAM, while, the arrangement, illustrated in FIG. 7B, is suitable for the construction of relatively large capacity RAM.

The reason why the arrangement, illustrated in FIG. 7A or 7B, is suitable for the construction of the IIL memory circuit device, is as follows. The discharging currents are absorbed from the parasitic capacitors existing in the bulk, that is the word line $W_-$ (see FIG. 5). At this time, the discharging currents flow through the parasitic resistors R (see FIG. 5). Thus, the voltage drop is generated across each of the parasitic resistors R. It is apparent that such voltage drops should be generated uniformly throughout the parasitic resistors R along each memory-cell array. If unbalance of voltage potential is induced in the bulk, it is difficult to obtain an uniform discharge of word lines $W_-$, thus it is difficult to achieve high speed read and correct write operations. It should be recognized that the arrangements, shown in FIGS. 7A and 7B, are useful for suppressing the induction of said unbalance of the voltage potential in the bulk.

Figure 8:
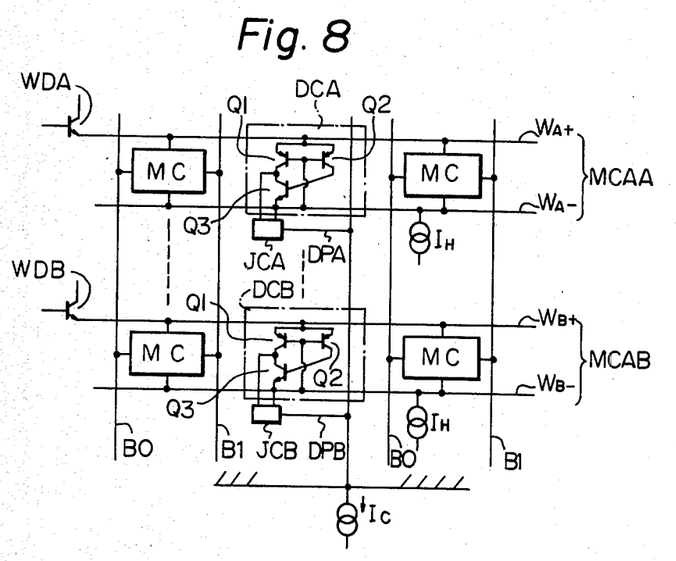
FIG. 8 illustrates an equivalent circuit diagram of partial memory-cell arrays and their peripheral members, in which discharging means according to the present invention, made of, for example dummy cells, are employed.

However, insertion of the discharging means DS into the IIL memory cells MC, induces an undesired problem. The problem is that the discharging means DS acts as an irregular portion with respect to the adjacent memory cells MC. In other words, a continuity, created along the successive memory cells, is broken by the irregular portion where the discharging means is located. If the continuity is broken by the irregular portion, it is a known fact that the threshold current for writing data, flowing through the memory cell which is located adjacent to the irregular portion, abnormally increases. In order to overcome the above mentioned known fact, the applicant of the present invention has proposed a means for smoothing the irregular portion, called a dummy cell (DC) in U.S. Pat. No. 4,228,525. The dummy cell includes the injector, as does the IIL memory cell, the threshold current, flowing through the adjacent memory cell, is shunted by the injector. Consequently, the increase of the threshold current can be suppressed. In short, it is preferable for the dummy cell to be formed with a pattern identical to the pattern of the memory cell. The discharging means, comprised of the dummy cells (DC), are shown in FIG. 8. Each of the dummy cells DC comprises transistors which are identical to the transistors Q1, Q2 and Q3 comprising each memory cell MC. The transistor Q3 may be substituted for a transistor which is identical to the transistor Q4 of the memory cell MC. Since the dummy cells DC (DCA, DCB and so on) do not conduct the read and write operation, it is not necessary to use two transistors, identical to the transistors Q3 and Q4 for storing data. Accordingly, either one of the identical transistors, Q3 and Q4, can be employed, and this transistor is always conductive. Transistors, identical to the transistors Q5 and Q6 of the memory cell MC, are not required in the cell DC. The dummy cells DC (DCA, DCB and so on) are connected to the constant-current source $I_C$ via respective junction members JC, (JCA, JCB and so on) and respective discharging paths DP (DPA, DPB and so on). Each of the junction members JC is activated to supply the discharging current therethrough back to the constant-current source $I_C$, only when the corresponding memory-cell array is changed from the selection status to the non-selection status. In other words, the junction members JC discharge the electric charges of the word lines $W_-$, which change from the selection status to the non-selection status.

Figure 9A:
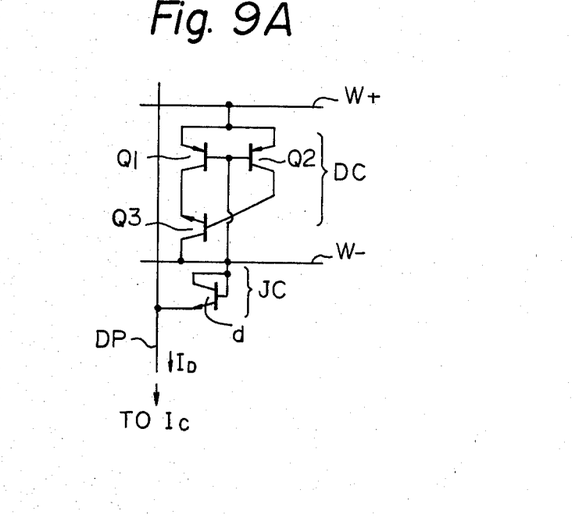
FIG. 9A illustrates an equivalent circuit diagram of the dummy cell DC which cooperates with a diode d acting as the junction member JC.

The junction member can be made of either a transistor, a diode, a resistor or a series connected diode and a resistor. FIG. 9A is an equivalent circuit diagram of the dummy cell (DC) which connected with the diode d acting as the junction member (JC). The members, represented by the symbols $Q_1$, $Q_2$, $Q_3$, DC, $W_+$, $W_-$, DP, have already been explained. The diode d is comprised of a transistor, where the collector and the base of the transistor are shorted so as to obtain a function of a diode. The anode of the diode is connected to the word line $W_-$ and the cathode thereof is connected to the discharging path DP which leads to the constant-current source $I_C$. It should be understood that, as schematically shown in FIG. 9D identical diodes d of other memory-cell arrays (not shown in FIG. 9A) are also connected, at their anodes, to respective word lines ($W_-$), while, the cathodes of diodes are commonly connected to the single discharging path DP. Accordingly, one of the diodes d connected to the word line $W_-$ changing from the selection status ("H" level) to the non-selection status, is conductive. At this time, the anodes of the remaining diodes receive the voltage level "L", and are non-conductive. Therefore, the discharging current $I_D$ can be absorbed only from the parasitic capacitors existing along the selected word line $W_-$.

Figure 9B:
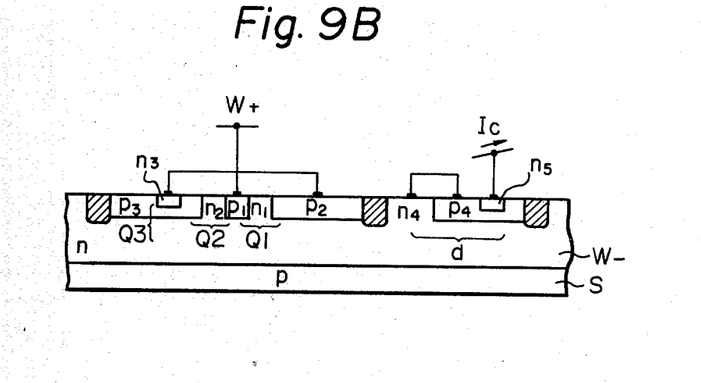
FIG. 9B is a cross sectional view of basic layout for constructing the circuit diagram shown in FIG. 9A.
Figure 9C:
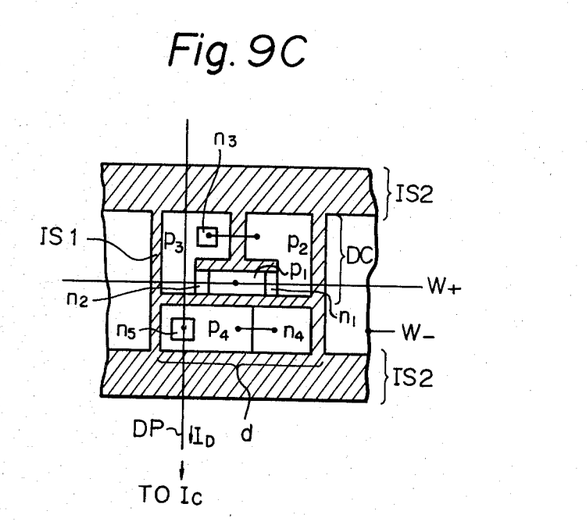
FIG. 9C is a plan view of the actual layout for constructing the circuit diagram shown in FIG. 9A.
Figure 9D:
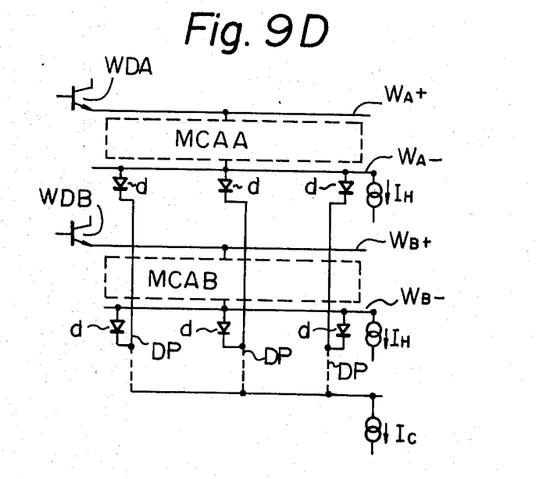
FIG. 9D is an equivalent circuit diagram schematically illustrating the layout of the diodes d in the IIL memory circuit device.

FIG. 9B is a cross sectional view of basic layout for constructing the circuit diagram shown in FIG. 9A. Regions, represented by the symbols p1 through p4, are p-type regions, and regions, represented by the symbols n1 through n5, are n-type regions. The hatch marked regions represent isolation regions. FIG. 9C is a plan view of actual layout for constructing the circuit diagram shown in FIG. 9A.

Figure 10A:
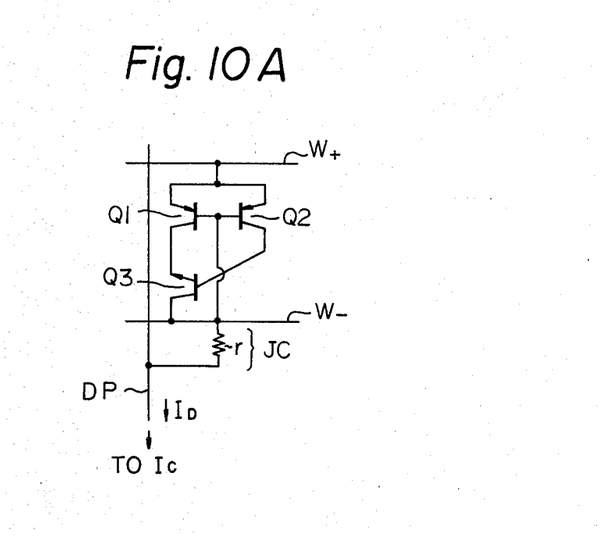
FIG. 10A illustrates an equivalent circuit diagram of the dummy cell DC which cooperates with a resistor r acting as the junction member JC.
Figure 10B:
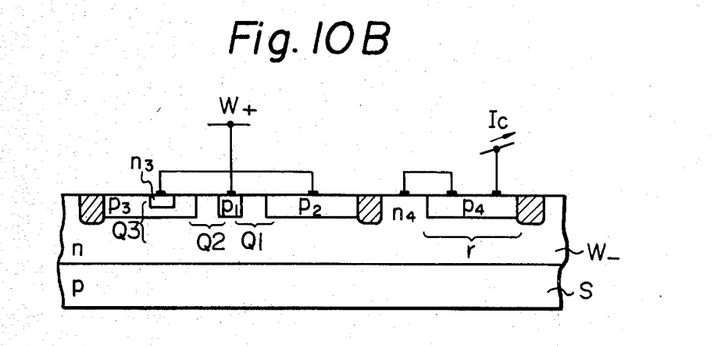
FIG. 10B is a cross sectional view of basic layout for constructing the circuit diagram shown in FIG. 10A.
Figure 10C:
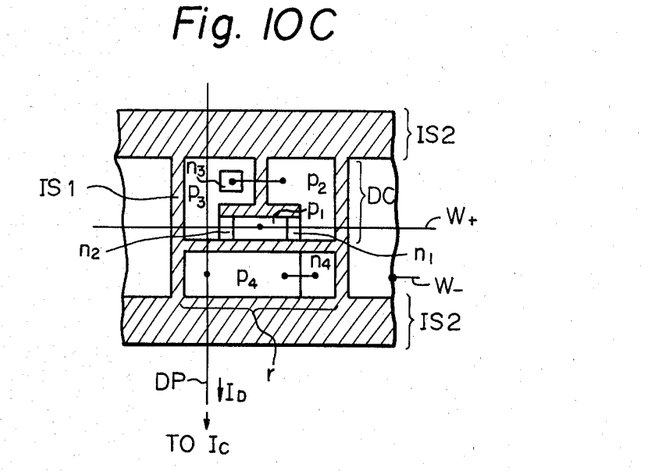
FIG. 10C is a plan view of an actual layout for constructing the circuit diagram shown in FIG. 10A.
Figure 10D:
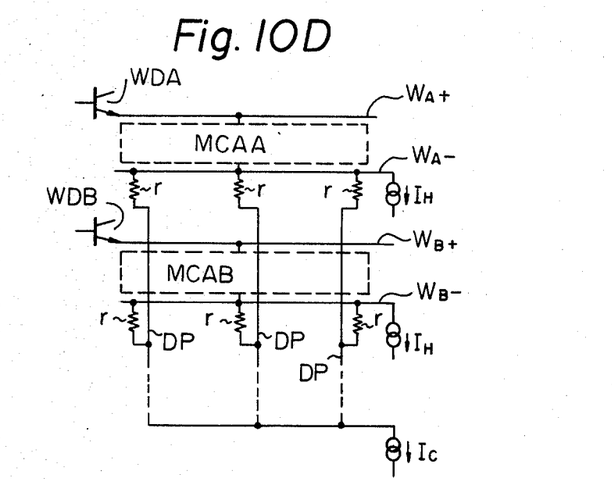
FIG. 10D is an equivalent circuit diagram schematically illustrating the layout of the resistors r in the IIL memory circuit device.

FIG. 10A illustrates an equivalent circuit diagram of the dummy cell (DC) which cooperates with the resistor r acting as the junction member (JC). One end of the resistor r is connected to the word line W_ and the other end thereof is connected to the discharging path DP. It should be understood that, as schematically shown in FIG. 10D, identical resistors r of other memory-cell arrays (not shown in FIG. 10A) are also connected, at each one end thereof, to respective word lines (W_), while, each other end thereof, is connected to the discharging path DP. The resistance value of each resistor r should be determined such that the discharging current $I_D$ does not flow toward the non-selected word lines W_. FIG. 10B is a cross sectional view of basic layout for constructing the circuit diagram shown in FIG. 10A. FIG. 10C is a plan view of actual layout for constructing the circuit diagram shown in FIG. 10A.

The junction member, comprised of the resistor r (FIG. 10A) has an advantage, when compared to the junction member which is comprised of the diode d (FIG. 9A), in that the discharging current $I_D$, flowing through the resistor r, can continue flowing for a longer time than the time during which the discharging current $I_D$ flows through the diode d. Thus, the electric charges, stored in the parasitic capacitors C, can fully be absorbed through the resistor r. This is because, the diode d is no longer conductive and cuts off the discharging current $I_D$, when the diode d is reverse biased. However, the junction member, comprised of the diode d (FIG. 9A) has an advantage, when compared to the junction member which is comprised of the r (FIG. 10A), that is, the diode d stops the discharging current $I_D$ from flowing toward the non-selected word line W_.

Figure 11A:
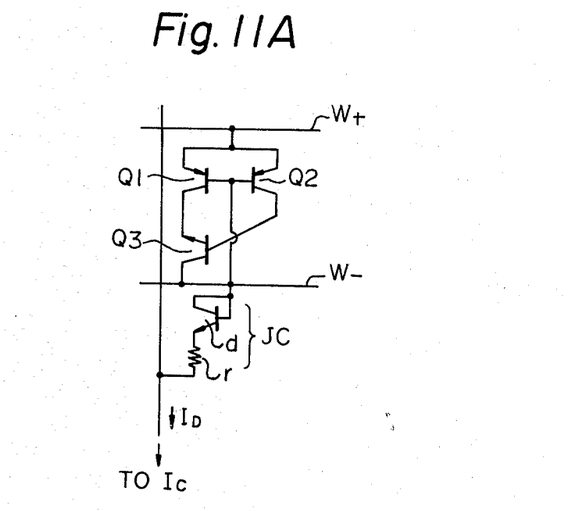
FIG. 11A illustrates an equivalent circuit diagram of the dummy cell DC which cooperates with a diode d and resistor r, connected in series, both acting as the junction member JC.
Figure 11B:
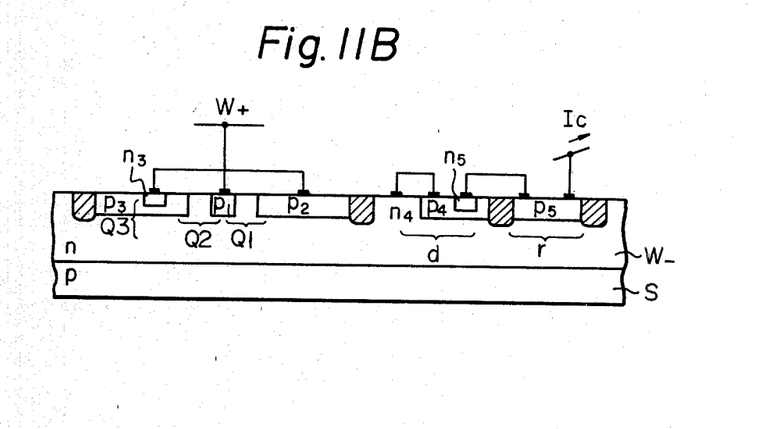
FIG. 11B is a cross sectional view of the basic layout for constructing the circuit diagram shown in FIG. 11A.
Figure 11C:
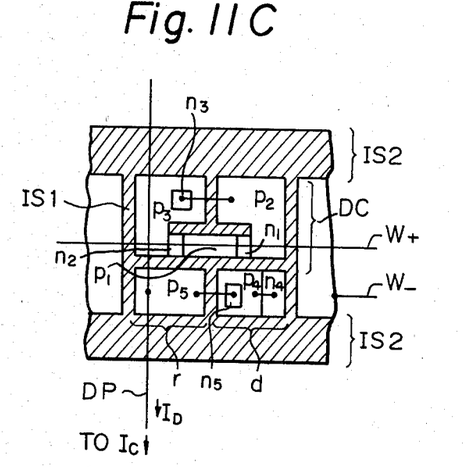
FIG. 11C is a plan view of an actual layout for constructing the circuit diagram shown in FIG. 11A.
Figure 11D:
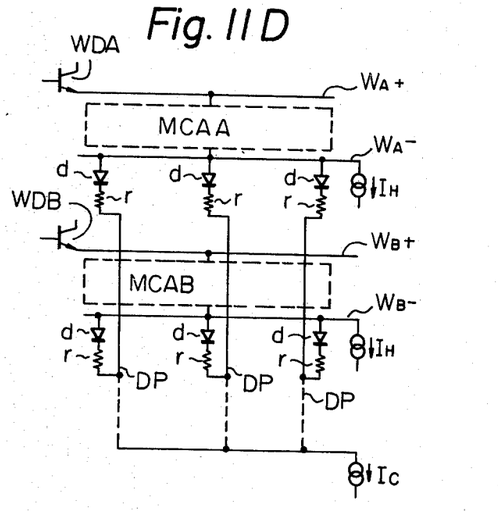
FIG. 11D is an equivalent circuit diagram schematically illustrating the layout of the pairs of series connected diodes d and resistors r.

Therefore, it is preferable to make the junction member JC by using the series connected diode d and resistor r. FIG. 11A illustrates an equivalent circuit diagram of the dummy cell (DC) which connected to the series connected diode d and resistor r, comprising the junction member JC. The anode of the diode d is connected to the word line W_, the cathode thereof is connected to one end of the resistor r, the other end of the resistor r is connected to the discharging path DP. It should be understood that, as schematically shown in FIG. 11D, identical pairs of series connected diodes d and resistors r of other memory-cell arrays (not shown in FIG. 11A) are also connected between respective word lines (W_) and the common discharging path DP. FIG. 11B is a cross sectional view of the circuit diagram shown in FIG. 11A. FIG. 11C is a plan view of the actual layout for constructing the circuit diagram shown in FIG. 11A.

Figure 12:
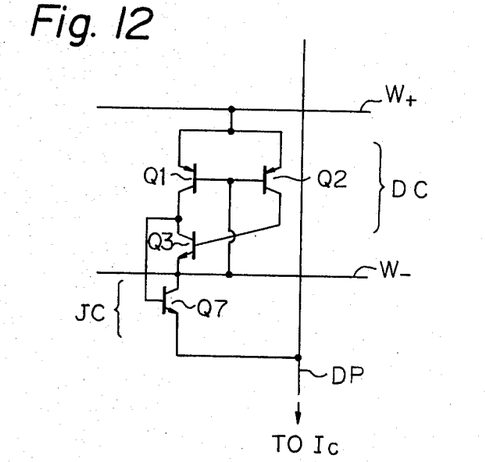
FIG. 12 is an equivalent circuit diagram of the dummy cell DC which cooperates with a transistor Q7 acting as the junction member JC.

The junction member JC can also be fabricated by a transistor. FIG. 12 illustrates an equivalent circuit diagram of the dummy cell (DC) which is connected to the transistor acting as the junction member (JC). It should be understood that, as illustrated by the elements JCA, JCB in FIG. 8, identical transistors Q7 of other memory-cell arrays (not shown in FIG. 12) are also connected, at their collectors, to respective word lines W_ and also connected, at their emitters, to the common discharging path DP. The voltage level, at the base of the transistor Q7, should be proportional to the voltage level developed at a suitable position within the dummy cell DC, such that the voltage level varies in accordance with the variation of the voltage level on the word line W_. Therefore, in the example illustrated in FIG. 12, the base of the transistor Q7 is connected to the collector of the aforesaid transistor Q3. The function of the transistor Q7 is substantially the same as that of the diode d shown in FIG. 9A. The location of the transistor Q7 may be the same as that of the transistor Q5 to be positioned in the IIL memory cell MC (see FIG. 1). Similarly, the location of each of the aforesaid diodes d, resistors r and pairs of series connected diodes d and resistors r, may be the same as that of the transistor Q5 positioned in the IIL memory cell MC (see FIG. 1).

Further, it is also preferable to locate a transistor, comprising the aforementioned hold-current source $I_H$, at the position where the transistor Q6 is positioned in the IIL memory cell MC.

Figure 13A:
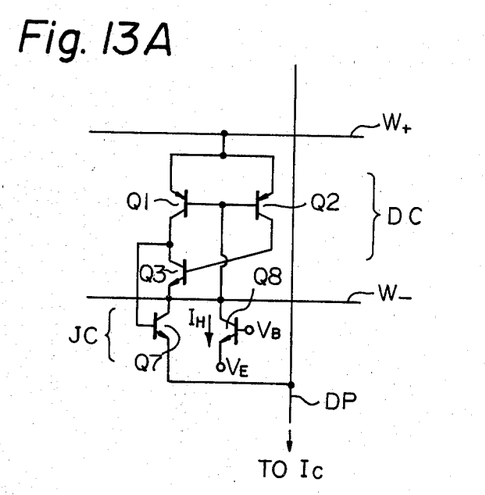
FIG. 13A is an equivalent circuit diagram of the dummy cell DC, the junction member JC, being comprised of the transistor Q7, and the hold-current source $I_H$ being comprised of a transistor Q8.

Thus, if the transistors Q5 and Q6 of the IIL memory cell MC shown in FIG. 1, are respectively substituted for the junction member JC and the hold-current source $I_H$, the dummy cell DC, the junction member JC and the hold-current source $I_H$ may be fabricated with a layout which is almost identical to the layout of the IIL memory cell MC, which in fact, contributes to realizing a very highly integration memory circuit device. One example of the above mentioned layout is illustrated in FIG. 13A. FIG. 13A is an equivalent circuit diagram of the dummy cell DC, the junction member JC comprising the transistor Q7 (see FIG. 12), and the hold-current source $I_H$ which comprises a transistor Q8. It should be recognized that the junction member JC is not limited to the transistor Q7, but is also applicable with respect to the diode d (see FIG. 9A), the resistor r (see FIG. 10A) or the series connected diode d and resistor r (see FIG. 11A).

Figure 13B:
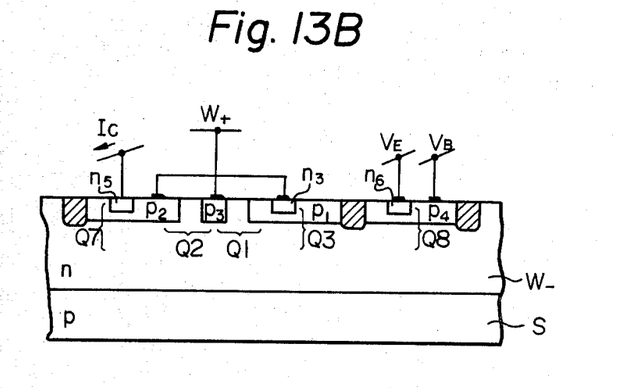
FIG. 13B is a cross sectional view of a basic layout for constructing the circuit diagram shown in FIG. 13A.
Figure 13C:
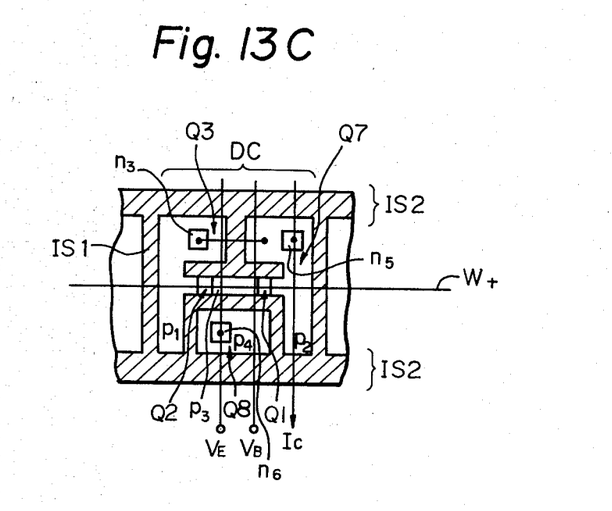
FIG. 13C is a plan view of an actual layout for constructing the circuit diagram shown in FIG. 13A.

FIG. 13B is a cross sectional view of a basic layout for constructing the circuit diagram shown in FIG. 13A. FIG. 13C is a plan view of an actual layout for constructing the circuit diagram shown in FIG. 13A.

As mentioned above, the IIL memory circuit device according to the present invention, has a capability for achieving high speed read and write operations and also produces no write error, that is the "double write".

What is claimed is:

1. A semiconductor memory device fabricated on a bulk semiconductor base having parasitic capacitance, comprising:
   a plurality of memory-cell arrays, each of the memory-cell arrays extending in a first direction and including a plurality of IIL (integrated injection logic) memory cells for storing data arranged in the first direction, the memory-cell arrays being arranged with a specified pitch in a second direction perpendicular to the first direction;
   word line pairs arranged in the first direction, each pair having first and second word lines, and each word line having a selection and non-selection status and each of the second word lines comprising said bulk;
   the memory-cell arrays respectively, operatively connected to a corresponding one of said pairs of word lines;

a plurality of pairs of bit lines extending in the second direction and operatively connected to each of said plurality of memory cell arrays;

hold-current sources respectively, operatively connected to a corresponding one of said second word lines, for holding the data stored in the IIL memory cells;

at least one discharging path, operatively connected to each of the second word lines; and constant-current sources, operatively connected to said discharging path, for providing a discharging current, in accordance with said parasitic capacitance existing in the bulk and along the word lines, for the second word lines changing from said selection status to said non-selection status, said parasitic capacitance being discharged through the constant-current source via the discharging path.

2. A device as set forth in claim 1, wherein said discharging path is located in the center of each of the memory-cell arrays.

3. A device as set forth in claim 1, further comprising a plurality of the discharging paths uniformly distributed on each of the memory-cell arrays.

4. A device as set forth in claim 2 or 3, further comprising means for smoothing an irregular portion created where the discharging path is operatively connected to each of the second word lines.

5. A device as set forth in claim 4, having a read and a write operation, wherein each of the IIL memory cells comprises:

first and second transistors, interconnected with each other and connected to the corresponding one of said second word lines, for storing data, third and fourth transistors, connected to the corresponding one of said first word lines, acting as load transistors for the first and second transistors, respectively, and fifth and sixth transistors, each having a specified position on said bulk and connected to the corresponding one of said word second lines, to a corresponding one of the bit line pairs, and further acting as buffer transistors for achieving read and write operations, and wherein the means for smoothing the irregular portion comprises dummy cells, each including transistors corresponding to the third and fourth transistors and one of the first and second transistors, wherein said device further comprises a junction circuit having two terminals and operatively connected between the constant-current source and the dummy cell, wherein the junction circuit conducts current from a corresponding one of the second word lines which changes from the selection status to the non-selection status.

6. A device as set forth in claim 5, wherein the junction circuit comprises a transistor having a collector operatively connected to a corresponding one of the word second lines and, an emitter operatively connected to the discharging path (DP).

7. A device as set forth in claim 5, wherein the junction circuit comprises a diode having an anode connected to a corresponding one of the second word lines, and a cathode connected to the discharging path.

8. A device as set forth in claim 5, wherein the junction circuit comprises a resistor connected between a corresponding one of the second word lines and the discharging path.

9. A device as set forth in claim 5, wherein the junction circuit comprises a series connected diode and resistor, connected between a corresponding one of the second word lines and the discharging path.

10. A device as set forth in claim 5, wherein the junction circuit is located at a position corresponding to the position of the fifth transistor in each of the IIL memory cells.

11. A device as set forth in claim 5, wherein the hold-current source is located at a position corresponding to the position of the sixth transistor in each of the IIL memory cells.

12. A device as set forth in claim 6, wherein one terminal of each of the junction members is connected to the corresponding second word line and the other terminal of each of the junction members is connected to the discharging path.

13. A device as set forth in claim 12, wherein the dummy cells and junction members, are located on respective memory-cell arrays such that the dummy cells and the junction circuits are arranged along straight lines in said second direction.

14. A device as set forth in claim 13, wherein each of the discharging paths is distributed along a respective straight line in a direction being parallel to the direction in which the bit lines are distributed.

15. A device as set forth in claim 7, wherein one terminal of each of the junction members is connected to the corresponding second word line and the other terminal of each of the junction members is connected to the discharging path.

16. A device as set forth in claim 8, wherein one terminal of each of the junction members is connected to the corresponding second word line and the other terminal of each of the junction members is connected to the discharging path.

17. A device as set forth in claim 9, wherein one terminal of each of the junction members is connected to the corresponding second word line and the other terminal of each of the junction members is connected to the discharging path.

18. A device as set forth in claim 15, wherein the dummy cells and junction members are located on respective memory-cell arrays such that the dummy cells and the junction circuits are arranged along straight lines in said second direction.

19. A device as set forth in claim 16, wherein the dummy cells and junction members are located on respective memory-cell arrays such that the dummy cells and the junction circuits are arranged along straight lines in said second direction.

20. A device as set forth in claim 17, wherein the dummy cells and junction members are located on respective memory-cell arrays such that the dummy cells and the junction circuits are arranged along straight lines in said second direction.

21. A device as set forth in claim 18, wherein each of the discharging paths is distributed along a respective straight line in a direction being parallel to the direction in which the bit lines are distributed.

22. A device as set forth in claim 19, wherein each of the discharging paths is distributed along a respective straight line in a direction being parallel to the direction in which the bit lines are distributed.

23. A device as set forth in claim 20, wherein each of the discharging paths is distributed along a respective straight line in a direction being parallel to the direction in which the bit lines are distributed.

* * * * *

UNITED STATES PATENT AND TRADEMARK OFFICE
CERTIFICATE OF CORRECTION

PATENT NO. : 4,374,431

DATED : February 15, 1983

INVENTOR(S) : ONO ET AL.

It is certified that error appears in the above-identified patent and that said Letters Patent is hereby corrected as shown below:

Front page, [57] ABSTRACT, line 6, "work" should be --word--.
[line numbering is off in column 1]
    Column 3, line 17, "Q2" should be --Q3--.
    Column 4, line 42, "state" should be --states--;
             line 56, delete "under-"
             line 57, "stood" should be --recognized--.
    Column 5, line 59, after "logic" insert --state--.
    Column 6, line 8, after "," insert --corresponding to the logic state stored in the newly selected memory cell,--;
             line 56, delete "ex-";
             line 57, "pected" should be --achieved--;
             line 57, delete "one there of resides in in the fact";
             line 58, "that" should be --is--.
    Column 7, line 17, delete ", has";
             line 35, "MCA," should be --MCA, they--.

Signed and Sealed this

Thirtieth Day of August 1983

[SEAL]

Attest:

GERALD J. MOSSINGHOFF

Attesting Officer     Commissioner of Patents and Trademarks